TRANSISTOR MAGNETIC AMPLIFIER CIRCUIT

Filed Jan. 29, 1954

INVENTOR.
GLADDEN B. HOUCK, JR.
BY
H. S. Mackey
ATTORNEY

United States Patent Office 2,819,352

Patented Jan. 7, 1958

2,819,352

TRANSISTOR MAGNETIC AMPLIFIER CIRCUIT

Gladden B. Houck, Jr., Port Chester, N. Y., assignor to General Precision Laboratory Incorporated, a corporation of New York Application January 29, 1954, Serial No. 407,009

12 Claims. (Cl. 179—171)

This invention relates to transistor circuits and more particularly to transistor amplifying circuits for driving a magnetic amplifier of the saturable core type.

Transistor amplifiers used as magnetic amplifier drivers have advantages of small size and high efficiency as compared to electronic tube circuits used for similar purposes.

In particular it has been found that when used as a class B stage of amplification to drive a magnetic amplifier circuit, transistors when properly connected may be made to vary over a very wide range of impedance values which adds greatly to the efficiency of operation of the magnetic amplifier.

The principal purpose of this invention is to provide a two-transistor amplifying circuit.

Another purpose of this invention is to provide a two-transistor amplifying circuit having push-pull current output suitable for driving a magnetic amplifier of the saturable core type.

Another purpose of this invention is to provide a balanced transistor amplifier employing two transistors of different types and emitting a push-pull current output.

Another purpose of this invention is to provide a balanced transistor amplifier employing two transistors of different types for excitation by a push-pull electrical signal and emitting an amplified push-pull electrical signal.

Another purpose of this invention is to provide a balanced transistor amplifier employing two transistors of the same type for excitation by a conjugate pair of electrical input signals of opposite polarity and emitting an amplified push-pull electrical signal.

A further understanding of this invention may be secured from the following detailed description with associated drawings, in which.

Figure 1:
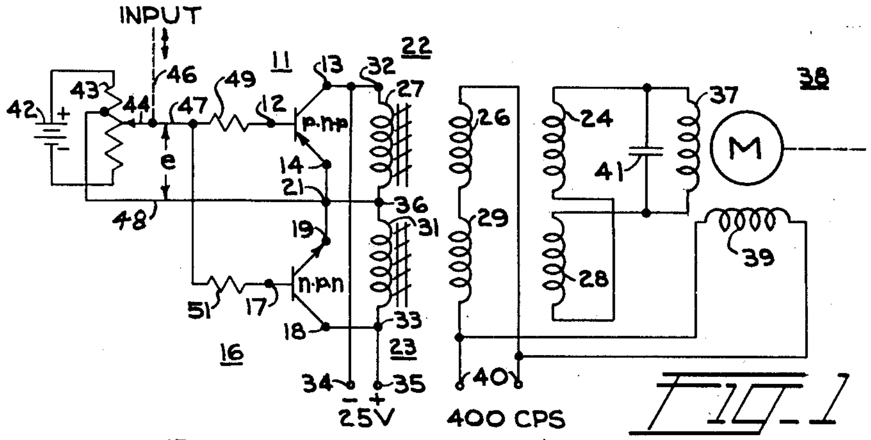
Figure 1 is a circuit diagram of a balanced driver employing one p-n-p transistor and one n-p-n transistor and a magnetic amplifier operating a two-phase motor.

Referring now to Fig. 1, a junction transistor 11 of the p-n-p type has a base terminal 12, collector terminal 13 and emitter terminal 14; and a second junction transistor 16 of the n-p-n type has a base terminal 17, collector terminal 18 and emitter terminal 19. The emitter terminals 14 and 19 are connected together at a common terminal 21. A magnetic amplifier stage is driven by these transistors and employs two similar but separate saturable core transformers 22 and 23. Transformer 22 contains an output load or secondary winding 24, an energizing or primary winding 26, and an exciting or control winding 27. The primary winding is designed for energization at 400 C. P. S., 115 volts, and the control winding has a resistance of 3000 ohms and is designed for an excitation range of zero to 8 milliamperes. The other transformer 23 has a secondary winding 28, primary winding 29, and control winding 31. The two control windings are connected in series, the two primary windings are connected in series, and the two secondary windings are connected in series opposed relation with respect to the primary.

It is to be understood that any other saturable core magnetic transformers having push-pull input may be employed in place of the ones described, and they may be energized from any suitable source having any desired frequency, the frequency employed not being limited to 400 C. P. S.

The two collector terminals 13 and 18 of transistors 11 and 16 are connected to the end terminals 32 and 33 respectively of the saturable transformer control windings, and are also connected to a 25-volt direct-current source represented by terminals 34 and 35, terminal 35 being positive and connected to the n-p-n transistor collector terminal 18. The common emitter terminal 21 is connected to the common control winding terminal 36.

The magnetic amplifier output is very often employed to operate a small two-phase servomechanism motor, and as an example of this use the two amplifier output windings 24 and 28 are connected in series opposed to one field winding 37 of a two-phase motor 38 having its other field winding 39 connected to the 400 C. P. S. power supply terminals 40. A condenser 41 shunting winding 37 advances its phase by nearly 90°.

The transistor driver stage is excited by a direct-current or low-frequency signal applied between each base and emitter, the instantaneous polarities being made the same in the two transistors, with push-pull input effect, because of the difference in their types. Since the polarities are the same, the two input circuits can be effectively paralleled and excited from a single source having a potential swing through zero, that is, a push-pull source. This input signal is very often the direct-current output of a zero-frequency modulator or phase demodulator, but may be from any other source; any source whatever having the described output characteristics is suitable for excitation of the transistor stage. While for highest efficiency the impedance of the source should match the transistor stage input impedance, other considerations than efficiency are usually more important. Very generally, a signal source to excite a pair of junction transistors as described should have an impedance between 100 and 5000 ohms. The battery 42 shunted by the center-tapped voltage divider 43 schematically represents such an electrical source. The voltage divider slider 44 is mechanically moved, this action being represented by the dashed line 46 which therefore schematically represents the input signal function. This function is converted to a potential between the conductors 47 and 48 which can vary between positive and negative values. It may be useful for some purposes in regard to input signal as the magnitude of a current $i$ in conductor 47, which also can vary between positive and negative values.

The conductor 48 is connected to the common terminal 21, while the conductor 47 is connected through two stabilizing resistors 49 and 51 to the transistor base terminals 12 and 17 respectively. The function of the stabilizing resistors 49 and 51 is to cause the transistor control by the input signal to be less critical and to cause operation to be more stable. The resistance of the stabilizing resistors 49 and 51 should be equal but may vary between wide limits. For example, a resistance for each resistor of 560 ohms, or on the order of the base-emitter resistance of these transistors as used, has been found satisfactory.

In operation, when the input signal has a potential of from 0.1 volt to 0.3 volt, the conductor 47 being positive relative to conductor 48, current flows in collector 18 of the n-p-n transistor 16 but no current flows in the collector 13 of the p-n-p transistor 11. If the input signal be reversed in polarity so that conductor 47 is negative by 0.1 to 0.3 volt relative to conductor 48, current flows in the p-n-p collector 13 but none in the n-p-n collector 18. At some intermediate input signal potential close to zero both collector currents are zero or nearly zero. This action is analogous to that of a class B electronic amplifier and this transistor stage may be said to operate as a class B amplifier with balanced push-pull output.

When the input signal is zero with little or no collector current flowing in either transistor, the full 25-volt potential across supply terminals 34 and 35 is applied across the control windings 27 and 31 in series and the same current flows through both. The transformer impedances presented to their primary supply circuits are then equal, the primary potentials are equal and the secondary potentials are likewise equal. Since the secondary windings 24 and 28 are opposed, no current flows in motor field 37 and the motor is stationary. If the input signal should become positive at slider 44, a slight base current flows in transistor 16, producing collector current. This has the effect of partly short-circuiting control winding 31, greatly reducing its current and of increasing the current in winding 27. This in turn increases the impedance of primary winding 29, increasing the potential across it and consequently increasing the potential output of its secondary winding 28. By the opposite action the potential output of secondary winding 24 is decreased at the same time, so that the difference potential energizes motor field 37, causing the motor to operate. If the input signal becomes negative at slider 44, collector current flows in transistor 11 and causes the motor to run in the reverse direction.

As an illustration of the efficiencies to be expected in this circuit, let it be supposed that at balance a current of 4.17 milliamperes flows through each of the control windings 27 and 31. Let it be supposed that the current flowing through each transistor under this condition is 0.3 ma., although current may in some transistors be less than this down to one-tenth of this amount. The total current flowing in the supply circuit is then 4.47 milliamperes and the power, at 25 volts, is 112 milliwatts. The power consumed in both 300-ohm control windings is 104½ mw., so that the efficiency is $$\frac{104\frac{1}{2}}{112}=93\%$$

The efficiency drops somewhat at both sides of balance, then rises at the extreme conditions of excitation. For example, if the input signal is such as to decrease the current and increase the resistance through transistor 11, and change transistor 16 oppositely, so that 7.7 ma. flow in control winding 27 and 0.3 ma. in winding 31, then the voltage drop through control winding 27 is 23.1 volts and that through control winding 31 is 1.9 volts. The total power consumed in both control windings is then 184 ma. and the efficiency is 92%.

Figure 2:
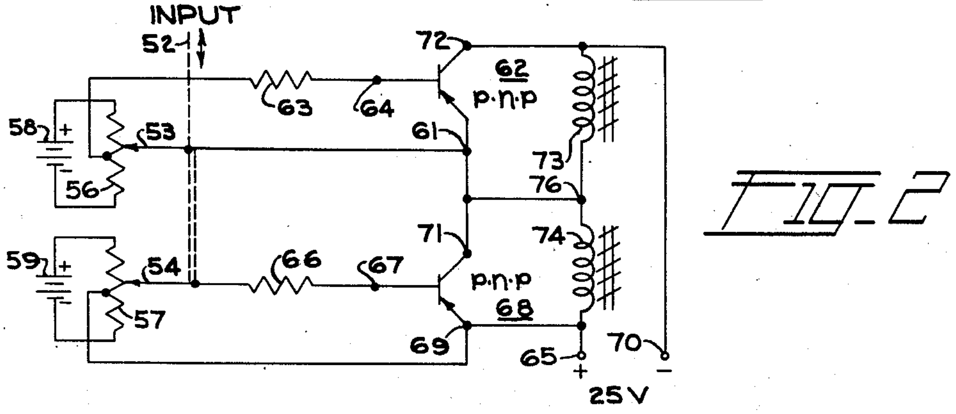
Figure 2 is a circuit diagram illustrating the use of a pair of p-n-p junction transistors in a class B driver circuit.

Two p-n-p transistors can be used in place of one p-n-p and one n-p-n transistor, but the change in circuit polarity requires the conversion of the input signal into a conjugate pair of electrical signals. A circuit involving this modification is shown in Fig. 2 with the required type of electrical input signal for class B operation schematically indicated by battery and divider circuits. A mechanical displacement input signal is indicated by dashed line 52, moving sliders 53 and 54 of voltage dividers 56 and 57 in concert. The dividers are energized by batteries 58 and 59. The slider 53 is connected to the emitter terminal 61 of a p-n-p transistor 62, and a midtap of voltage divider 56 is connected through a resistor 63 to the base terminal 64 of the same transistor. The slider 54 is connected through resistor 66 to the base terminal 67 of a second p-n-p transistor 68, and the midtap of voltage divider 57 is connected to its emitter terminal 69. Collector terminal 71 is connected to the emitter terminal 61 of the first transistor. The transistor collector circuit is similar to that of Fig. 1 except that one transistor is reversed. Collector 72 of transistor 62 is connected to the control coil 73 of a magnetic amplifier transformer and emitter terminal 69 is connected to the control coil 74 of a second magnetic amplifier transformer. The control coils are connected at terminal 76 in series and to emitter 61 and collector 71. A battery positive terminal 65 is connected to emitter 69 and the negative terminal 70 is connected to collector 72.

This circuit operates as a class B amplifier, for when the input displacement is at zero, at or near the centers of the voltage dividers, neither collector conducts, and when either base is positive the associated collector is nonconducting. When a base is negative its collector conducts current. Thus, when the sliders are in their uppermost positions, transistor 62 conducts and transistor 68 does not, and when the sliders are positioned in the opposed direction, transistor 68 conducts and transistor 62 does not. As described in connection with the embodiment of Fig. 1, change of the input signal from a positive magnitude through zero to a negative magnitude changes the ratio of currents in the control coils from above unity to below unity, correspondingly changing the magnetic amplifier output in magnitude and phase sense.

In place of a pair of p-n-p transistors, a pair of n-p-n transistors can be used if battery polarities be reversed. A circuit incorporating this modification is shown in Fig. 3, with the batteries and voltage dividers which are used to indicate schematically an input signal source rearranged for class A amplifier operation, in which output current flows at all times, even though the input signal is zero.

Figure 3:
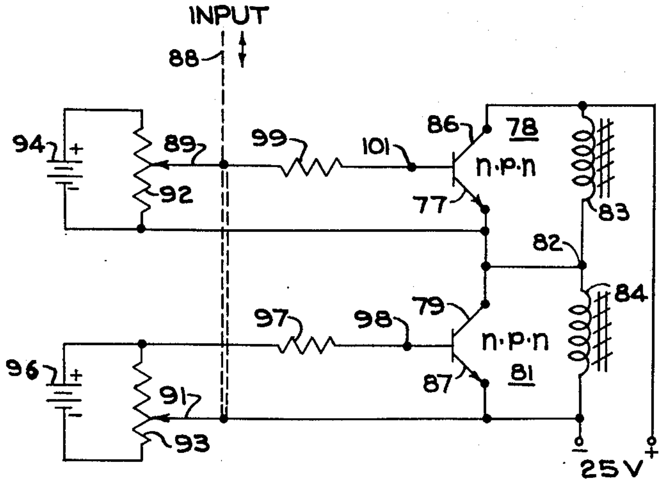
Figure 3 is a circuit diagram illustrating the use of a pair of n-p-n junction transistors in a class A driver circuit.

In Fig. 3 the emitter 77 of n-p-n transistor 78 is connected to the collector 79 of n-p-n transistor 81 and also to the common point 82 of control windings 83 and 84. The ends of the series control windings are connected to collector 86 and to emitter 87, and also across a source of potential, the positive terminal of which is connected to collector 86. The dashed line 88 representing an input signal displacement is connected to two sliders 89 and 91 moving in concert on their voltage dividers 92 and 93. The voltage dividers 92 and 93 are energized by batteries 94 and 96 respectively, with the negative end of the voltage divider 92 connected to emitter 77 and the positive end of voltage divider 93 connected through resistor 97 to base 98 of transistor 81. Slider 89 is connected through resistor 99 to base 101 of transistor 78 and slider 91 is connected to emitter 87.

At zero input signal half of maximum potential is applied to each transistor. Variations of the input signal produce conjugate opposite variations of the base-emitter input potentials, in turn producing conjugate linear changes in the control winding currents.

Numerous transistor circuits have been developed which are in some degree equivalent. For example, a grounded base circuit may be substituted for some purposes for a grounded emitter circuit. It is accordingly to be understood that the instant invention is not confined in its application to the described circuits, but is applicable to a number of other more or less equivalent circuits constructed in accordance with the principles disclosed herein.

What is claimed is:

1. A transistor magnetic amplifier circuit comprising, a pair of saturable magnetic core devices each including a control winding, said control windings being connected in series across a source of potential, a pair of transistors each having base, collector and emitter electrodes, means for differentially applying an input signal in parallel to the input circuits of said transistors, and means connecting each of said control windings directly to a respective output circuit of said transistors.

2. A transistor magnetic amplifier circuit comprising, a pair of saturable magnetic core devices each including a similar control winding, said control windings being connected in series across a source of potential, a pair of transistors each having base, collector and emitter electrodes, means for differentially applying an input signal in parallel to the base-to-emitter circuits of said transistors, and means connecting each of said control windings directly to a respective output circuit of said transistors.

3. A transistor magnetic amplifier circuit comprising a pair of saturable magnetic core devices each including a similar control winding, said control windings being connected in series across a source of potential, a pair of transistors each having base, collector and emitter electrodes, said transistors being connected to input and output circuits with their emitters common to said input and output circuits, means for differentially applying an input signal in parallel to the base-to-emitter circuits of said transistors, and means connecting each of said control windings directly to a respective output circuit of said transistors.

4. A transistor magnetic amplifier circuit comprising, a pair of saturable transformers each including a control winding, said control windings being connected in series across a source of potential, a pair of transistors each having base, collector and emitter electrodes, said transistors being connected to each other and to input and output circuits with their emitters common to said input and output circuits, means for differentially applying an input signal to the paralleled base-to-emitter circuits of said transistors, and means connecting each of said control windings directly to a respective output circuit of said transistors.

5. A transistor magnetic amplifier comprising, a pair of saturable transformers, a control winding for each of said transformers, said control windings being connected in series across a source of potential, a pair of transistors each having base, collector and emitter electrodes, means for differentially applying an input signal to the base-to-emitter circuits of said transistors, and circuit means connecting each of said control windings between the collector and emitter electrodes of a respective one of said transistors.

6. A transistor magnetic amplifier in accordance with claim 5 in which equal resistors are connected in series in each base electrode circuit.

7. A transistor magnetic amplifier comprising, a pair of saturable transformers, control windings for each of said transformers connected in series across a source of potential, an n-p-n junction transistor, a p-n-p junction transistor, the emitters of said transistors being directly and conductively connected together and to the common junction of said control windings, the end terminals of said control windings being directly and conductively connected to the respective collector electrodes of said transistors, and means for differentially applying an input signal to the base-to-emitter circuits of said transistors.

8. A transistor magnetic amplifier comprising, an n-p-n junction transistor, a p-n-p junction transistor, the emitter electrodes of said transistors being connected together and the collector electrodes thereof directly connected to opposite terminals of a potential source with the collector electrode of the n-p-n junction transistor connected to the positive terminal thereof, a pair of saturable reactor transformers each including a control winding, said control windings being connected in series with their common junction directly connected to the common emitter terminal of said transistors and their end terminals directly connected to said potential source, and a signal input circuit having one terminal thereof connected to said common emitter terminal and its remaining terminal connected to the base electrodes of each of said transistors.

9. A transistor magnetic amplifier in accordance with claim 8 having a resistor connected between said remaining terminal of the signal input circuit and the base electrode of one transistor and an equal value second resistor connected between said remaining signal input terminal and the base electrode of the other of said transistors.

10. A transistor magnetic amplifier comprising, a pair of p-n-p junction transistors having the emitter of one connected to the collector of the other, a pair of saturable reactor transformers each including a control winding, one of said control windings interconnecting the emitter and collector electrodes of one of said transistors and the other control winding interconnecting the emitter and collector electrodes of the other of said transistors, a source of potential connected to the end terminals of said control windings with the positive terminal thereof connected to the emitter terminal of said other transistor, a source of input signal, means for converting said input signal to a pair of separate reciprocally related conjugate electrical quantities, and means for respectively impressing said electrical quantities on said transistors.

11. A transistor magnetic amplifier comprising, a pair of n-p-n junction transistors having the emitter of one connected to the collector of the other, a pair of saturable reactor transformers each including a control winding, one of said control windings directly interconnecting the emitter and collector electrodes of one of said transistors and the other control winding directly interconnecting the emitter and collector electrodes of the other of said transistors, a source of potential connected to the end terminals of said control windings with the positive terminal thereof connected to the collector terminal of said one transistor, a source of input signal, means for converting said input signal to a pair of separate reciprocally related conjugate electrical quantities, and means for respectively impressing said electrical quantities on said transistors.

12. A transistor magnetic amplifier circuit comprising, a pair of saturable core transformers each including a similar direct-current control winding, said similar control windings being connected in series across a source of direct potential, a pair of transistors each having base, collector and emitter electrodes, means differentially applying an input signal to the base-to-emitter circuits of said transistors, and circuit means connecting each of said control windings directly in parallel with a respective collector-emitter internal path of said pair of transistors.

References Cited in the file of this patent

UNITED STATES PATENTS

| | | |
|---|---|---|
| 2,647,958 | Barney | Aug. 4, 1953 |
| 2,652,460 | Wallace | Sept. 15, 1953 |
| 2,653,282 | Darling | Sept. 22, 1953 |
| 2,666,818 | Shockley | Jan. 19, 1954 |
| 2,666,819 | Raisbeck | Jan. 19, 1954 |
| 2,680,160 | Yaeger | June 1, 1954 |

FOREIGN PATENTS

| | | |
|---|---|---|
| 684,626 | Great Britain | Dec. 24, 1952 |

OTHER REFERENCES

Bell text, "The Transistor," pages 373, pub. 1951 by Bell Tel. Labs. Inc., Murray Hill, N. J.

Sziklai article: Proc. I. R. E., June 1953, pages 717–724.

Shea text: "Principles of Transistor Circuits," pages 97–108, pub. Sept. 15, 1953, by John Wiley & Sons, New York, N. Y.